(12) United States Patent
Ho

(10) Patent No.: US 9,772,101 B2
(45) Date of Patent: Sep. 26, 2017

(54) LED DEVICE

(71) Applicant: Molex, LLC, Lisle, IL (US)

(72) Inventor: Yi-Tse Ho, Taipei (TW)

(73) Assignee: Molex, LLC, Lisle, IL (US)

( * ) Notice: Subject to any disclaimer, the term of this patent is extended or adjusted under 35 U.S.C. 154(b) by 207 days.

(21) Appl. No.: 14/478,327

(22) Filed: Sep. 5, 2014

(65) Prior Publication Data

US 2015/0131300 A1 May 14, 2015

(30) Foreign Application Priority Data

Sep. 6, 2013 (TW) .............................. 102216833 U

(51) Int. Cl.
| | | |
|---|---|---|
| *F21S 4/00* | (2016.01) | |
| *F21V 21/00* | (2006.01) | |
| *F21V 29/83* | (2015.01) | |
| *F21V 19/00* | (2006.01) | |
| *F21V 29/77* | (2015.01) | |

(Continued)

(52) U.S. Cl.
CPC .............. *F21V 29/83* (2015.01); *F21K 9/232* (2016.08); *F21V 19/0055* (2013.01); *F21V 29/77* (2015.01); *H05K 1/0204* (2013.01); *H05K 1/0209* (2013.01); *H05K 1/0284* (2013.01); *H05K 3/182* (2013.01); *F21V 3/00* (2013.01); *F21Y 2107/40* (2016.08); *F21Y 2115/10* (2016.08); *H05K 3/0014* (2013.01); *H05K 3/105* (2013.01); *H05K 3/381* (2013.01); *H05K 2201/09063* (2013.01); *H05K 2201/09118* (2013.01); *H05K 2201/09154* (2013.01); *H05K 2201/09645* (2013.01); *H05K 2201/09781* (2013.01); *H05K 2201/09854* (2013.01); *H05K 2201/10106* (2013.01); *H05K 2201/10113* (2013.01); *H05K 2201/10287* (2013.01);

(Continued)

(58) Field of Classification Search
CPC .......... F21K 9/135; F21K 9/30; F21V 19/003; F21V 19/0055; F21V 29/70; F21V 29/77; F21V 29/83; H05K 1/0203; H05K 1/0204; H05K 1/0209; H05K 1/0284; H05K 3/182; H05K 2201/10106
USPC ............................................. 362/249.02, 800
See application file for complete search history.

(56) References Cited

U.S. PATENT DOCUMENTS

| | | | | |
|---|---|---|---|---|
| 8,143,769 B2 * | 3/2012 | Li | .......................... | F21V 29/004 313/46 |
| 8,282,250 B1 * | 10/2012 | Dassanayake | ............ | F21V 3/00 362/249.02 |
| 8,382,333 B2 * | 2/2013 | Chen | ................... | F21V 23/0457 362/218 |

FOREIGN PATENT DOCUMENTS

TW M447458 U 2/2013

* cited by examiner

*Primary Examiner* — Jason Moon Han
(74) *Attorney, Agent, or Firm* — James A. O'Malley

(57) ABSTRACT

An illumination device comprises a holder, a plurality of light emitting elements, a translucent cover and a lamp cap structure. The holder comprises a heat dissipating base body and a carrying unit. The carrying unit is connected to a top portion of the heat dissipating base body and comprises a carrying base body, a circuit pattern and a heat dissipating pattern, the circuit pattern and the heat dissipating pattern are directly formed to a surface of the carrying base body, the circuit pattern has a plurality of mounting positions, the heat dissipating pattern at least extends from a region close to the mounting position to a region where the heat dissi- (Continued)

pating pattern can contact the heat dissipating base body. The plurality of light emitting elements are respectively provided at the plurality of the mounting positions and establish an electrical connection with the circuit pattern.

23 Claims, 6 Drawing Sheets

(51) Int. Cl.
*H05K 1/02*        (2006.01)
*H05K 3/18*        (2006.01)
*F21K 9/232*       (2016.01)
*F21V 3/00*        (2015.01)
*H05K 3/00*        (2006.01)
*H05K 3/10*        (2006.01)
*H05K 3/38*        (2006.01)
*F21Y 115/10*      (2016.01)
*F21Y 107/40*      (2016.01)

(52) U.S. Cl.
CPC .............. *H05K 2201/10409* (2013.01); *H05K 2203/107* (2013.01)

LED DEVICE

RELATED APPLICATIONS

This application claims priority to Taiwanese Application No. 102216833, filed Sep. 6, 2013, which is incorporated herein by reference in its entirety.

FIELD OF THE PRESENT DISCLOSURE

The present disclosure relates to a holder for providing a light emitting element and an illumination device, and particularly relates to a holder having a three-dimensional metallic heat dissipating pattern and an illumination device.

BACKGROUND OF THE PRESENT APPLICATION

Recently, a light emitting element which is most interested is a light emitting diode (LED), the LED has been widely applied in many fields due to its advantages of energy saving, environmental protection, long service life and the like, especially many types of products in the illumination field have been developed, and one type is a bulb lamp. There are many manners to mount the light emitting element in the existing bulb lamps. For example, Taiwanese patent No. TWM447458 disclose a bulb lamp, in which molded interconnect device (MID) technology is used to form a three-dimensional circuit board and a light emitting element is mounted to the three-dimensional circuit board.

Since a board body of the three-dimensional circuit board is made by a material which is not electrically conductive, the heat dissipation efficiency is not high, heat energy generated by the light emitting element during light emission is not easily dissipated rapidly and is built up in the light emitting element and a region near the light emitting element, thus the light emitting efficiency and the service life of the light emitting element would be effected.

SUMMARY OF THE PRESENT DISCLOSURE

Therefore, an object of the present disclosure is to provide a holder for providing a light emitting element and capable of improving heat dissipation efficiency.

Another object of the present disclosure is to provide an illumination device which has a better heat dissipation efficiency.

Accordingly, an illumination device of the present disclosure comprises a holder, a plurality of light emitting elements, a translucent cover and a lamp cap structure. The holder comprises a heat dissipating base body and a carrying unit. The carrying unit is connected to a top portion of the heat dissipating base body and comprises a carrying base body, a circuit pattern and a heat dissipating pattern, the circuit pattern and the heat dissipating pattern are directly formed to a surface of the carrying base body, the circuit pattern has a plurality of mounting positions, the heat dissipating pattern at least extends from a region close to the mounting position to a region where the heat dissipating pattern can contact the heat dissipating base body. The plurality of light emitting elements are respectively provided at the plurality of the mounting positions and establish an electrical connection with the circuit pattern. The translucent cover is assembled to the holder and covers the carrying unit and the plurality of light emitting elements. The lamp cap structure is assembled to the heat dissipating base body.

In an embodiment of the illumination device of the present disclosure, the carrying base body has a plurality of mounting faces which are not parallel to each other, and the plurality of the mounting positions are distributed on the plurality of mounting faces.

In an embodiment of the illumination device of the present disclosure, the heat dissipating base body has a surrounding wall and a top platform connected to a top side of the surrounding wall, the carrying base body is assembled to and engaged with the heat dissipating base body and has a bottom face in contact with the top platform In an embodiment of the illumination device of the present disclosure, at least a part of the heat dissipating pattern extends to the bottom face so as to contact the top platform.

In an embodiment of the illumination device of the present disclosure, the carrying base body further has at least a heat dissipating hole, at least a part of the heat dissipating pattern extends through a wall surface defining the heat dissipating hole to the bottom face so as to contact the top platform of the heat dissipating base body.

In an embodiment of the illumination device of the present disclosure, the heat dissipating base body is integrally formed with the carrying base body and is hollow.

In an embodiment of the illumination device of the present disclosure, a part of the heat dissipating pattern covers a boundary between the carrying base body and the heat dissipating base body.

In an embodiment of the illumination device of the present disclosure, the part of the heat dissipating pattern further extends to at least a part of an outer surface of the heat dissipating base body.

In an embodiment of the illumination device of the present disclosure, the carrying base body has at least a heat dissipating hole, at least a part of the heat dissipating pattern extends to an inner surface of the carrying base body and an inner surface of the heat dissipating base body via a wall surface defining the heat dissipating hole.

The effects f the present disclosure are as follows: heat generated by the light emitting element can be directly conducted to the heat dissipating base body via the heat dissipating pattern, and in turn can be dissipated by the heat dissipating base body, so that the dissipation efficiency can be significantly improved. Furthermore, as the dissipation efficiency is increased, the heat dissipating base body may be made by a material which is lower in cost but poorer in heat efficiency so as to meet different requirements.

BRIEF DESCRIPTION OF THE DRAWINGS

The other features and effects of the present disclosure will be apparent through embodiments with reference to the Figures, and in which.

DETAILED DESCRIPTION OF THE PREFERRED EMBODIMENTS

Figure 1:
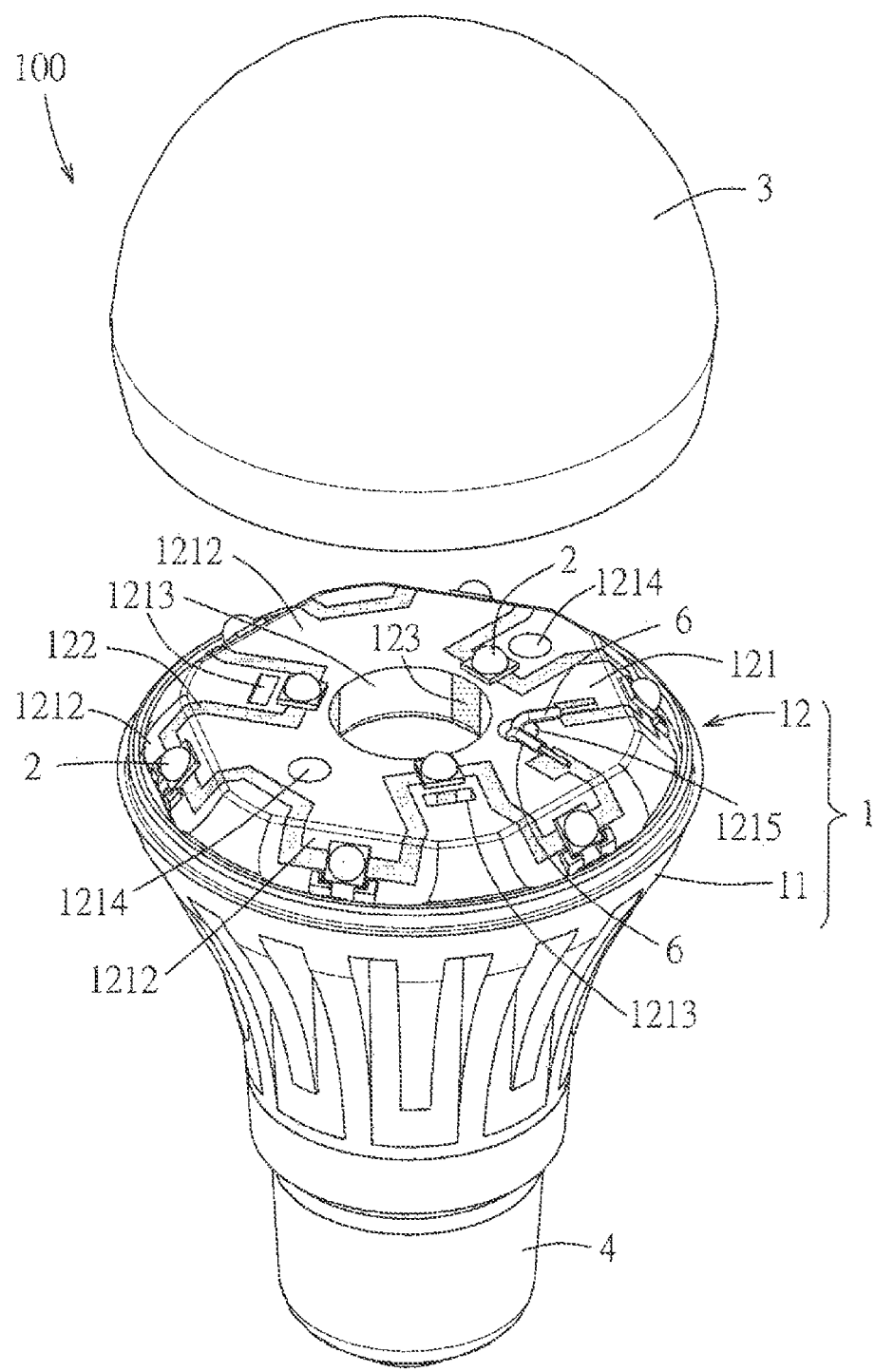
FIG. 1 is an exploded perspective view illustrating a first embodiment of an illumination device of the present disclosure.
Figure 2:
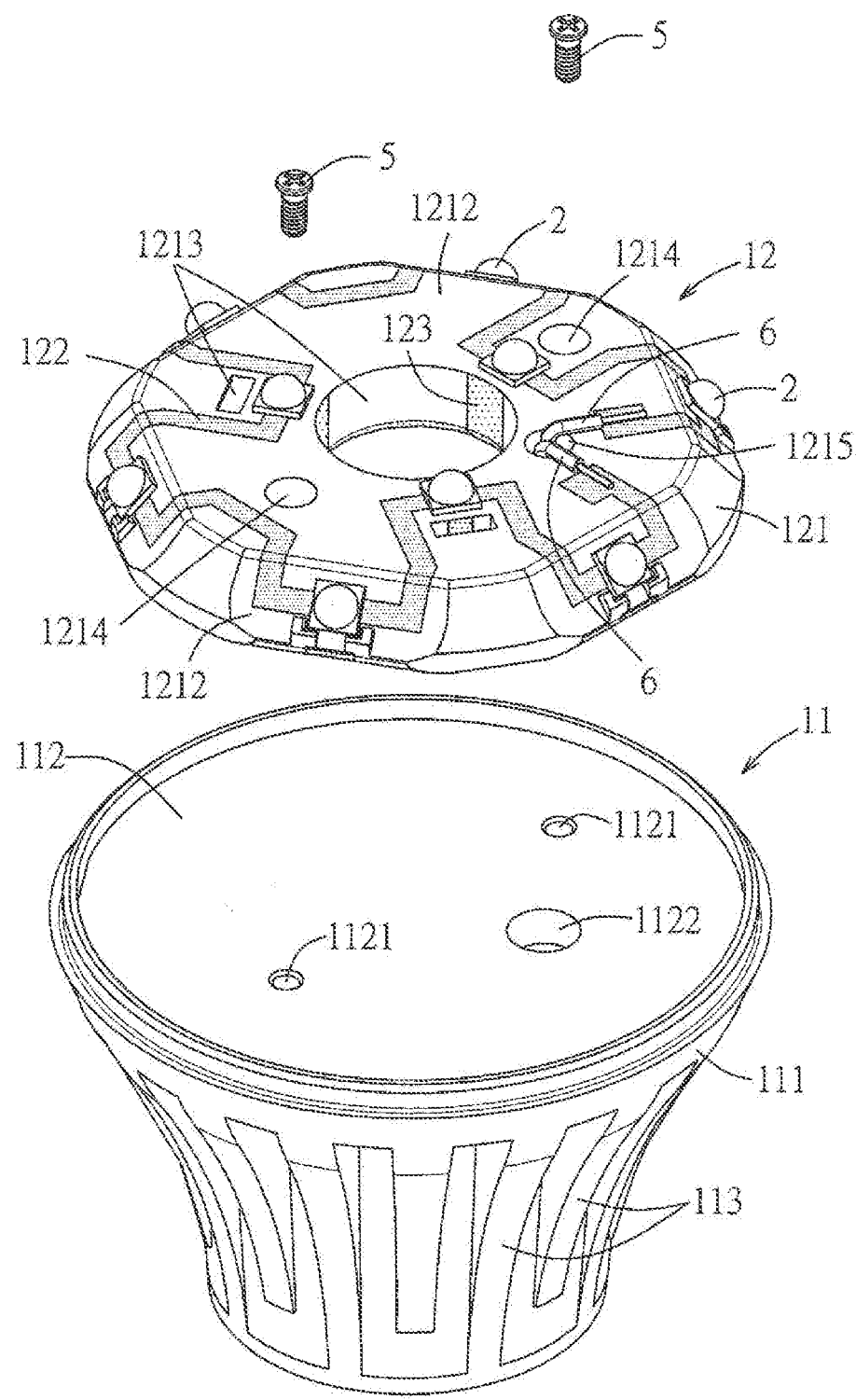
FIG. 2 is an exploded perspective view illustrating a holder of the first embodiment.
Figure 3:
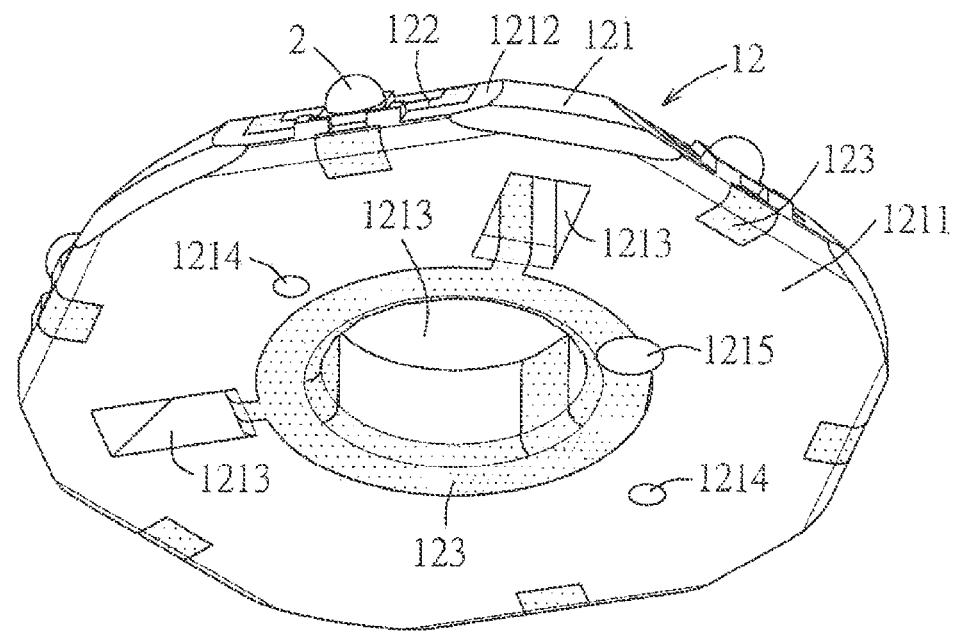
FIG. 3 is a perspective view illustrating a carrying unit of the holder of the first embodiment.
Figure 4:
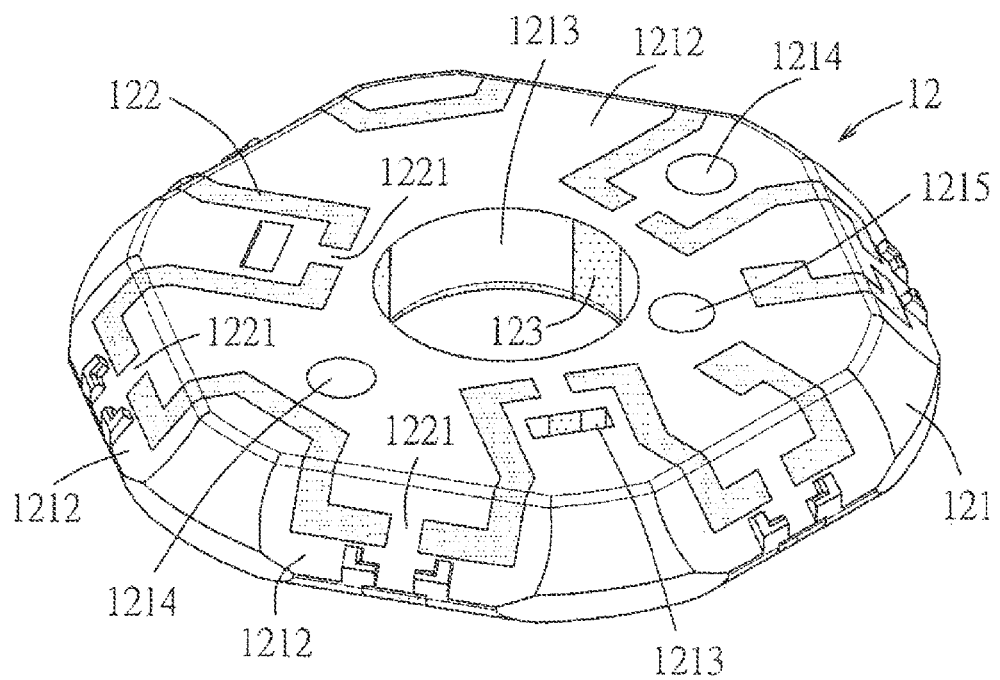
FIG. 4 is a perspective view illustrating the carrying unit of the holder of the first embodiment.

Before the present disclosure is described in detail, it should be noted that similar elements are indicated by the same reference numeral in the following description.

Referring to FIG. 1 through FIG. 4, an illumination device 100 of a first embodiment of the present disclosure comprises a holder 1, a plurality of light emitting elements 2, a translucent cover 3 and a lamp cap structure 4.

The holder 1 comprises a heat dissipating base body 11 and a carrying unit 12 connected to a top portion of the heat dissipating base body 11. The heat dissipating base body 11 is hollow in interior thereof, and has a surrounding wall 111 and a top platform 112 connected to a top side of the surrounding wall 111. The surrounding wall 111 is formed with a plurality of heat dissipating fins 113 spaced apart from each other and arranged on an outer periphery of the surrounding wall 111. The carrying unit 12 comprises a carrying base body 121, a circuit pattern 122 and a heat dissipating pattern 123. The carrying base body 121 is assembled to and engaged with the heat dissipating base body 11 and has a bottom face 1211 in contact with the top platform 112, a plurality of mounting faces 1212 which are not parallel to each other, and a plurality of heat dissipating holes 1213. Specifically, the mounting faces 1212 of the carrying base body 121 comprise a horizontal mounting face parallel to the bottom face 1211 and a plurality of oblique mounting faces connected between the horizontal mounting face and the bottom face 1211, and the heat dissipating holes 1213 pass through the horizontal mounting face 1212 and the bottom face 1211 and comprise one heat dissipating hole which is circular and positioned at the center and the other heat dissipating holes which are rectangular. The circuit pattern 122 and the heat dissipating pattern 123 are directly formed to a surface of the carrying base body 121. In the embodiment, the circuit pattern 122 and the heat dissipating pattern 123 are formed by laser direct structuring (LDS) technology and directly formed on the carrying base body 121 by using steps of laser eroding, metallizing and the like so as to form a three-dimensional arrangement pattern. In the embodiment, metallic materials used in the circuit pattern 122 and the heat dissipating pattern 123 have good electrical conductivity and thermal conductivity.

The circuit pattern 122 has a plurality of mounting positions 1221 to provide the plurality of light emitting elements 2 and establish an electrical connection, the heat dissipating pattern 123 at least extends from regions close to the plurality of mounting positions 1221 to regions where the heat dissipating pattern 123 can contact the heat dissipating base body 11. Specifically, the plurality of mounting positions 1221 are distributed on the plurality of mounting faces 1212, wherein the horizontal mounting face is provided with the mounting positions and the oblique mounting faces each are provided with one mounting position, the plurality of light emitting elements 2 emit lights from different angles via the plurality of mounting faces 1212. The circuit pattern 122 is interrupted at each mounting position 1221 to allow a positive electrode and a negative electrode of the light emitting element 2 to be electrically connected to the circuit pattern 122 at both sides of the each mounting position 1221. Moreover, in the embodiment, a part of the heat dissipating pattern 123 extends through a wall surface defining the heat dissipating hole 1213 to the bottom face 1211 so as to contact the top platform 112 of the heat dissipating base body 11, a part of the heat dissipating pattern 123 extends from a region close to the mounting position 1221 to the bottom face 1211 so as to contact the top platform 112.

By that heat dissipating pattern 123 extends from the region close to each mounting position 1221 to the bottom face 1211 of the carrying base body 121 so as to contact the top platform 112 of the heat dissipating base body 11, heat generated by the each light emitting element 2 is rapidly transferred to the heat dissipating base body 11 in a direct thermal conduction manner, and in turn is dissipated by the heat dissipating base body 11, so that the dissipation efficiency is significantly improved. As the dissipation efficiency is increased, the heat dissipating base body 11 may be made by a material which is lower in cost but poorer in heat efficiency, such as plastic material, so as to meet different requirements. Naturally, the heat dissipating base body 11 may be also made by a metallic material, such as aluminum alloy. The carrying base body 121 is made by a material which is not electrically conductive, such as plastic material or ceramic material.

The plurality of light emitting elements 2 are respectively provided at the plurality of the mounting positions 1221 and establish an electrical connection with the circuit pattern 122. In the embodiment, the plurality of light emitting elements 2 are connected in series. The translucent cover 3 is assembled to the holder 1, and covers the carrying unit 12 and the plurality of light emitting elements 2. The lamp cap structure 4 is assembled to the heat dissipating base body 11 and is used to electrically connect an external power. In the embodiment, the carrying base body 121 is formed with two through holes 1214 and one wire aperture 1215, the top platform 112 of the heat dissipating base body 11 is correspondingly formed with two through holes 1121 and one wire aperture 1122. The through holes 1214, 1121 are used to engage fasteners 5 so as to fix the assembly of the carrying base body 121 and the heat dissipating base body 11. The wire apertures 1215, 1122 are used to pass through wires 6. The heat dissipating base body 11 is provided with a driving plate (not shown) therein, and the circuit pattern 122 is connected to the driving plate via the wires 6, the driving plate is connected to the lamp cap structure 4 via, for example, a wire (not shown), so as to transmit the external power to the plurality of light emitting elements 2. Although the plurality of light emitting elements 2 are provided in the embodiment, it can be understood that only one light emitting element 2 may be provided in a modified embodiment.

Figure 5:
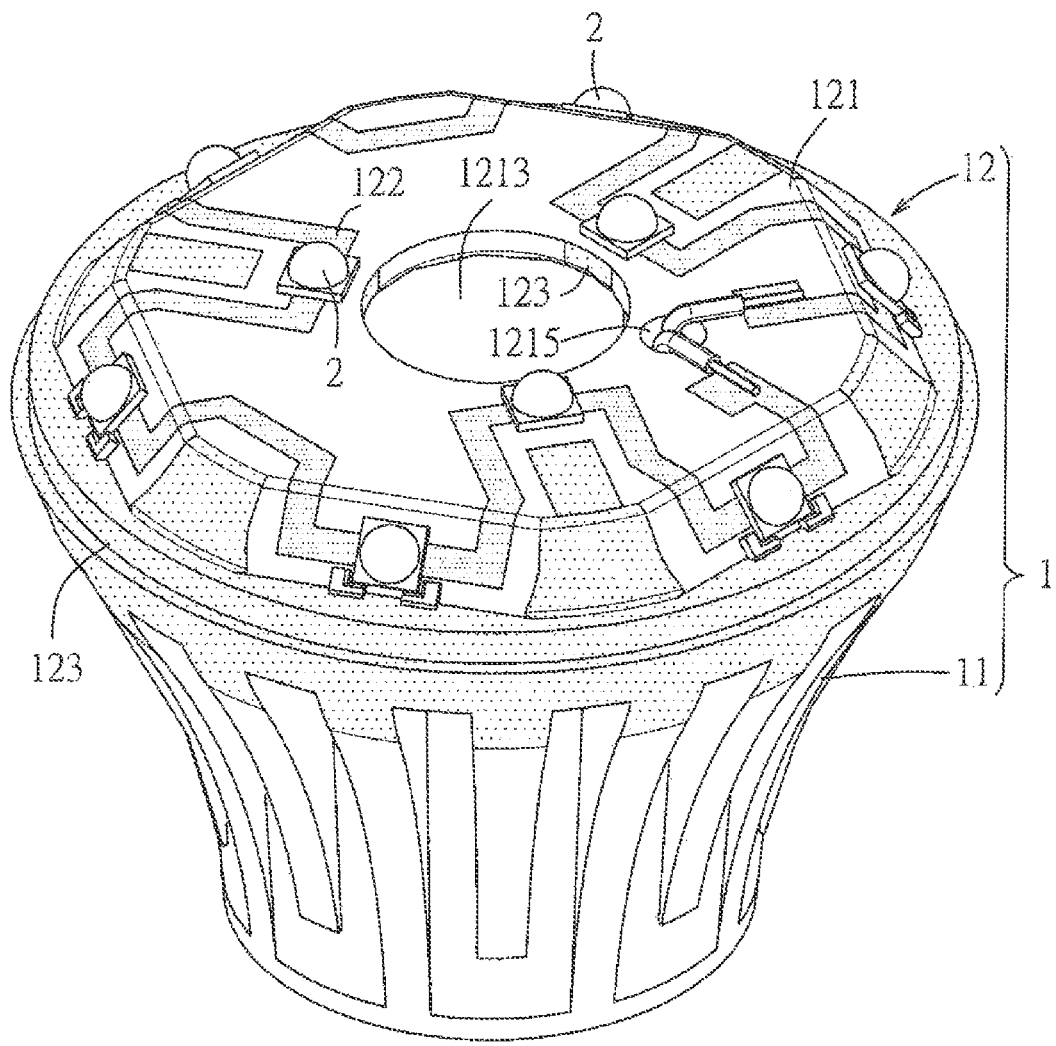
FIG. 5 is a perspective view illustrating an assembly relationship between a holder of and light emitting elements of an illumination device of a second embodiment of the present disclosure.
Figure 6:
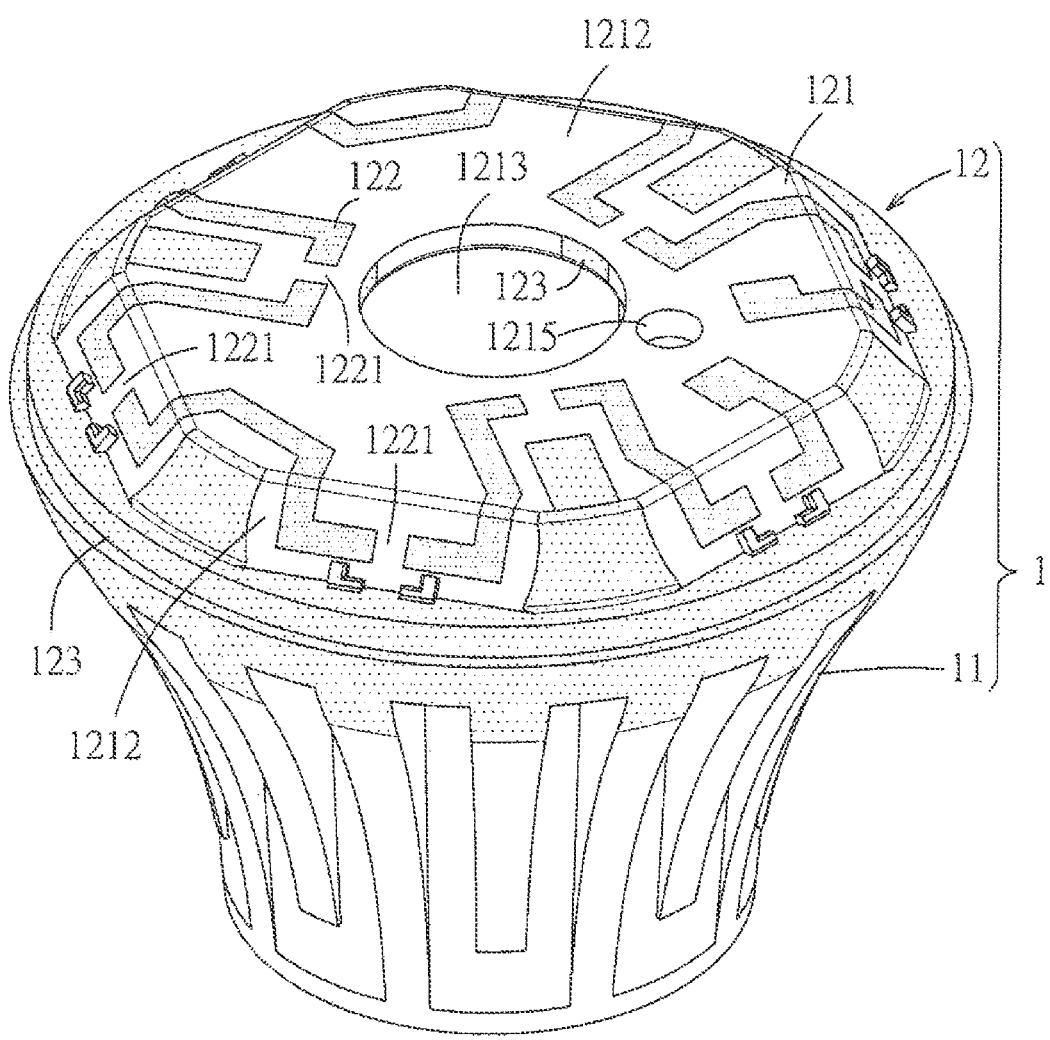
FIG. 6 is a perspective view illustrating the holder of the second embodiment.
Figure 7:
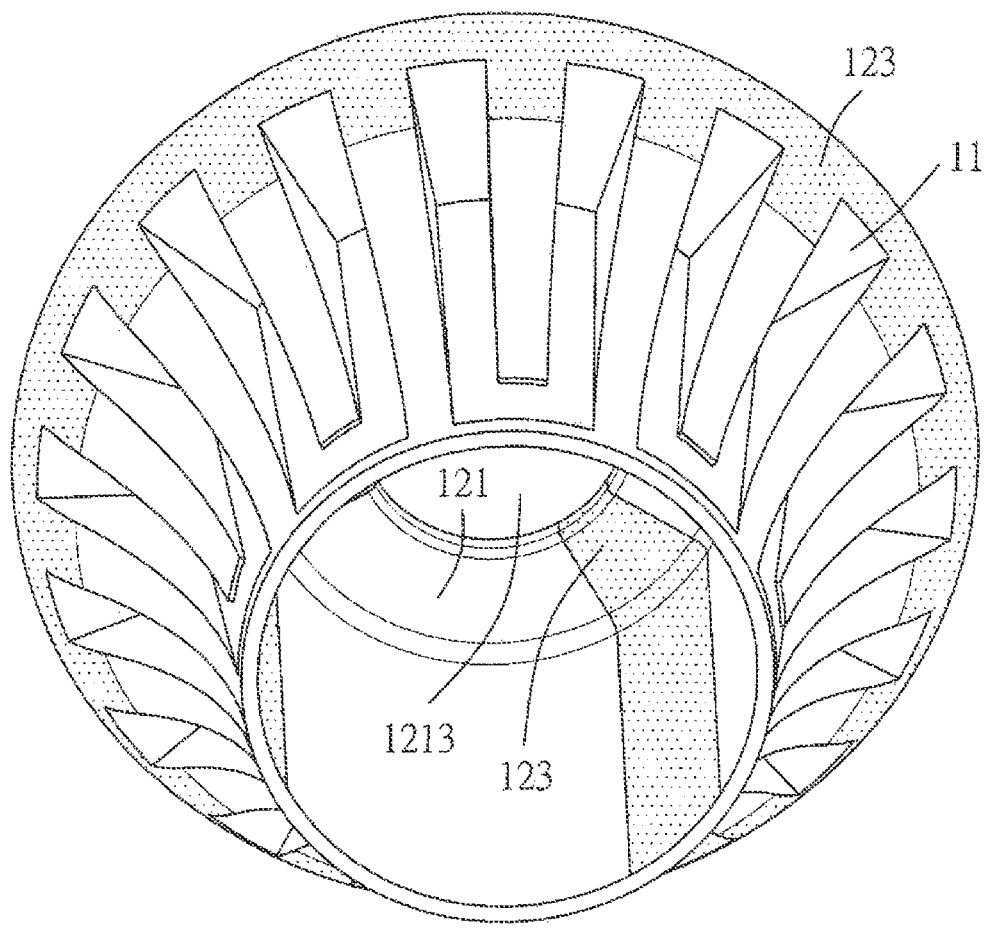
FIG. 7 is a view of FIG. 6, viewed from another angle, illustrating the holder of the second embodiment.

Referring to FIG. 5 through FIG. 7, an illumination device 100 of a second embodiment of the present disclosure is substantially the same as the first embodiment, however, in the second embodiment, the heat dissipating base body 11 is integrally formed with the carrying base body 121, a part of the heat dissipating pattern 123 extends from a region close to the mounting position 1221 and covers a boundary between the carrying base body 121 and the heat dissipating base body 11, and further extends to a part of an outer surface of the heat dissipating base body 11, another part of the heat dissipating pattern 123 extends to an inner surface of the carrying base body 121 and an inner surface of the heat dissipating base body 11 via a wall surface defining the heat dissipating hole 1213. In the embodiment, the carrying base body 121 is only formed with one heat dissipating hole 1213 which is circular and positioned at the center.

Similarly, by that the heat dissipating pattern 123 extends from the region close to the light emitting element 2 to the heat dissipating base body 11, heat generated by the light emitting element 2 is rapidly conducted to the heat dissipating base body 11, and in turn is dissipated by the heat dissipating base body 11, so that the dissipation efficiency is significantly improved.

In conclusion, heat generated by the light emitting element 2 can be directly conducted to the heat dissipating base body 11 via the heat dissipating pattern 123, and in turn can be dissipated by the heat dissipating base body 11, so that the dissipation efficiency can be significantly improved. Furthermore, as the dissipation efficiency is increased, the heat dissipating base body 11 may be made by a material which is lower in cost but poorer in heat efficiency so as to meet different requirements.

The above described are only the embodiments of the present disclosure, which cannot limit the scope of the implementation of the present disclosure, that is, simple equivalent variations and modifications made according to the scope of the Claims and the description content of the present disclosure are still fallen within the scope of the present disclosure.

What is claimed is:

1. A holder, comprising:
   a heat dissipating base body with a top portion; and
   a carrying unit connected to the top portion and comprising a carrying base body, a circuit pattern and a heat dissipating pattern, the carrying unit being formed of a non-electrically conductive material, the circuit pattern and the heat dissipating pattern being directly formed to a surface of the carrying base body by laser direct structuring (LDS) technology, the circuit pattern defining a mounting position where a light emitting element is configured to be mounted to the surface of the carrying base body to establish an electrical connection with the circuit pattern, the heat dissipating pattern at least extending from a region close to the mounting position to a region where the heat dissipating pattern can contact the heat dissipating base body.

2. The holder of claim 1, wherein the circuit pattern defines a plurality of mounting positions where respective light emitting elements are configured to be mounted to the surface of the carrying base body to establish an electrical connection with the circuit pattern, the heat dissipating pattern at least extends from regions respectively close to the plurality of mounting positions to regions where the heat dissipating pattern can contact the heat dissipating base body.

3. The holder of claim 2, wherein the carrying base body has a plurality of mounting faces which are not parallel to each other, and the plurality of the mounting positions are distributed on the plurality of mounting faces.

4. The holder of claim 2, wherein the heat dissipating base body has a surrounding wall and a top platform connected to a top side of the surrounding wall, the carrying base body is assembled to and engaged with the heat dissipating base body and has a bottom face in contact with the top platform.

5. The holder of claim 4, wherein at least a part of the heat dissipating pattern extends to the bottom face so as to contact the top platform.

6. The holder of claim 5, wherein the carrying base body further has at least a heat dissipating hole, at least a part of the heat dissipating pattern extends through a wall surface defining the heat dissipating hole to the bottom face so as to contact the top platform of the heat dissipating base body.

7. The holder of claim 2, wherein the heat dissipating base body is integrally formed with the carrying base body and is hollow.

8. The holder of claim 7, wherein a part of the heat dissipating pattern covers a boundary between the carrying base body and the heat dissipating base body.

9. The holder of claim 8, wherein the part of the heat dissipating pattern further extends to at least a part of an outer surface of the heat dissipating base body.

10. The holder of claim 9, wherein the carrying base body has at least a heat dissipating hole, at least a part of the heat dissipating pattern extends to an inner surface of the carrying base body and an inner surface of the heat dissipating base body via a wall surface defining the heat dissipating hole.

11. The holder of claim 1, wherein the heat dissipating base body has a surrounding wall which is formed with a plurality of heat dissipating fins.

12. The holder of claim 1, wherein the circuit pattern and the heat dissipating pattern are formed of metallic materials.

13. An illumination device, comprising:
   a holder, comprising:
      a heat dissipating base body with a top portion; and
      a carrying unit connected to the top portion and comprising a carrying base body, a circuit pattern and a heat dissipating pattern, the carrying unit being formed of a non-electrically conductive material, the circuit pattern and the heat dissipating pattern being directly formed to a surface of the carrying base body by laser direct structuring (LDS) technology, the circuit pattern defining a plurality of mounting positions, the heat dissipating pattern at least extending from a region close to the mounting positions to a region where the heat dissipating pattern can contact the heat dissipating base body;
   a plurality of light emitting elements respectively mounted to the surface of the carrying base body at the plurality of the mounting positions, the plurality of light emitting elements electrically connected with the circuit pattern;
   a translucent cover assembled to the holder and covering the carrying unit and the plurality of light emitting elements; and
   a lamp cap structure assembled to the heat dissipating base body.

14. The illumination device of claim 13, wherein the carrying base body has a plurality of mounting faces which are not parallel to each other, and the plurality of the mounting positions are distributed on the plurality of mounting faces.

15. The illumination device of claim 13, wherein the heat dissipating base body has a surrounding wall and a top platform connected to a top side of the surrounding wall, the carrying base body is assembled to and engaged with the heat dissipating base body and has a bottom face in contact with the top platform.

16. The illumination device of claim 15, wherein at least a part of the heat dissipating pattern extends to the bottom face so as to contact the top platform.

17. The illumination device of claim 16, wherein the carrying base body further has at least a heat dissipating hole, at least a part of the heat dissipating pattern extends through a wall surface defining the heat dissipating hole to the bottom face so as to contact the top platform of the heat dissipating base body.

18. The illumination device of claim 13, wherein the heat dissipating base body is integrally formed with the carrying base body and is hollow.

19. The illumination device of claim 18, wherein a part of the heat dissipating pattern covers a boundary between the carrying base body and the heat dissipating base body.

20. The illumination device of claim 19, wherein the part of the heat dissipating pattern further extends to at least a part of an outer surface of the heat dissipating base body.

21. The illumination device of claim 20, wherein the carrying base body has at least a heat dissipating hole, at least a part of the heat dissipating pattern extends to an inner surface of the carrying base body and an inner surface of the heat dissipating base body via a wall surface defining the heat dissipating hole.

22. The illumination device of claim 13, wherein the heat dissipating base body has a surrounding wall which is formed with a plurality of heat dissipating fins.

23. The illumination device of claim 13, wherein the circuit pattern and the heat dissipating pattern are formed of metallic materials.

* * * * *